United States Patent [19]

Morrison et al.

[11] Patent Number: 4,597,714
[45] Date of Patent: Jul. 1, 1986

[54] ROBOT GRIPPER FOR INTEGRATED CIRCUIT LEADFRAMES

[75] Inventors: Barry L. Morrison, Bedford; James W. Tolson, Dallas, both of Tex.

[73] Assignee: Thomson Components - Mostek Corporation, Carrollton, Tex.

[21] Appl. No.: 592,161

[22] Filed: Mar. 22, 1984

[51] Int. Cl.[4] .............................. B25J 15/00
[52] U.S. Cl. ................... 414/729; 901/30; 901/37
[58] Field of Search .............. 901/36, 39, 30; 414/729, 730; 294/86.25, 106, 116, 118

[56] References Cited

U.S. PATENT DOCUMENTS 3,051,327 8/1962 Goodell et al. ............... 901/39 X
4,234,223 11/1980 O'Neil ........................ 901/39 X

FOREIGN PATENT DOCUMENTS 960007 9/1982 U.S.S.R. ..................... 901/36 X

Primary Examiner—Terrance L. Siemens

[57] ABSTRACT

An apparatus for gripping a thin flexible object located within a gripping plane having a transverse axis and a longitudinal axis perpendicular to each other and to a linear axis which is perpendicular to the gripping plane, includes first and second sets of gripper claws for gripping the object. The sets of gripper claws are located on opposite sides of the longitudinal axis and are movable between closed and open positions. Means are provided for restricting the motion of the gripper claws in a direction perpendicular to the longitudinal axis so that the gripper claws are prevented from excessive inward movement toward the longitudinal axis beyond a desired predetermined amount. The means for moving the gripper claws to the predetermined desired distance define a gripping volume which is bounded by the gripping claws in the gripping plane along the transverse axis and is bounded in a direction parallel to the linear axis by a top volume bounding surface formed by a back-up bar and by a lower volume bounding surface formed by an inward projection of the gripper claws.

6 Claims, 12 Drawing Figures

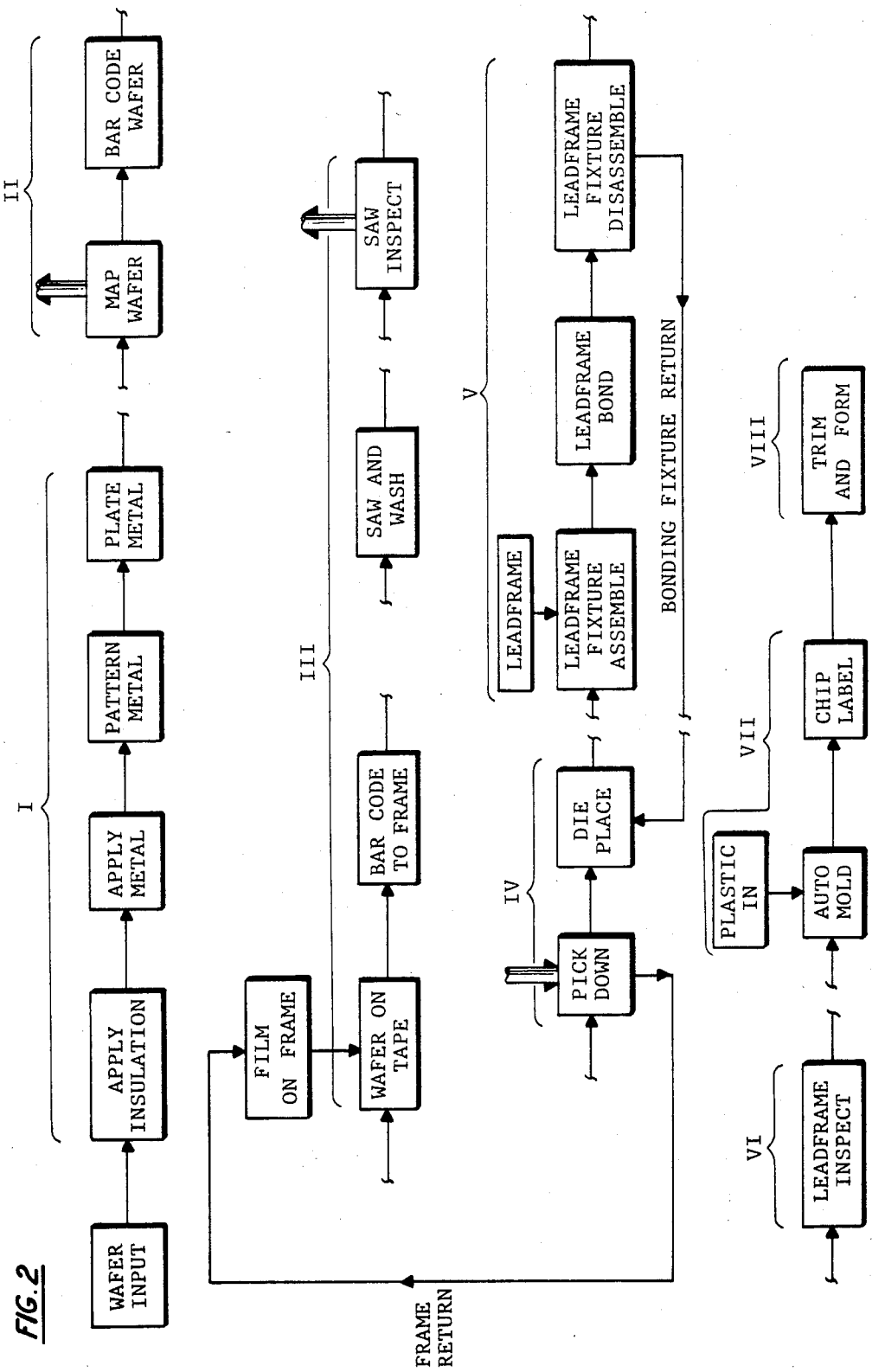

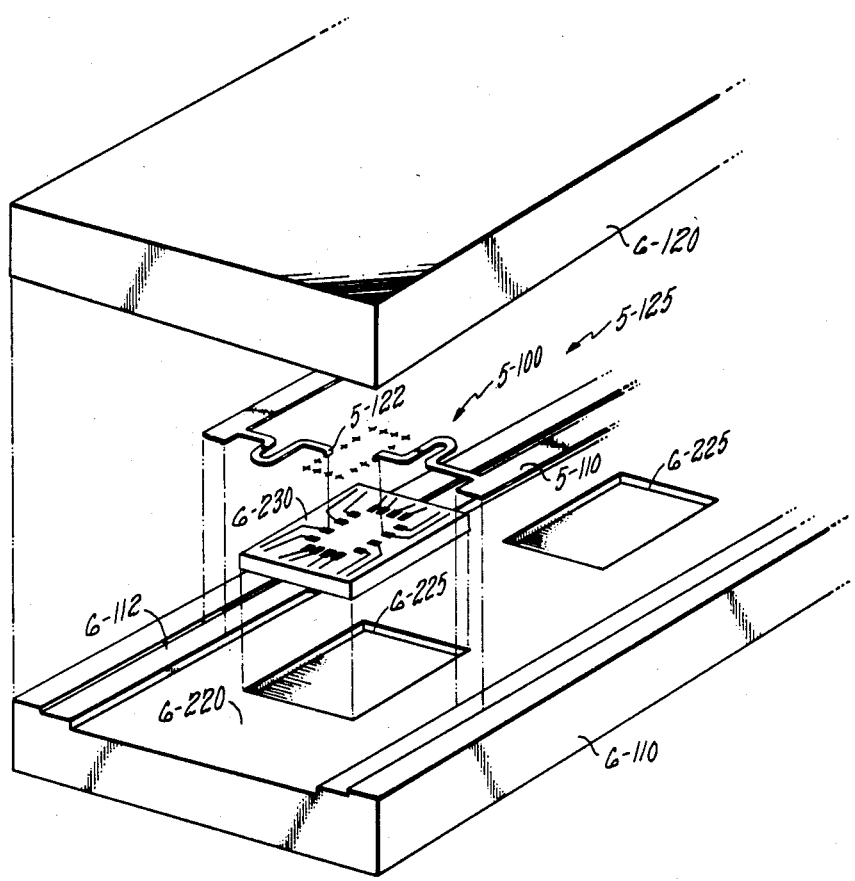

QUADRANT 20
28 PLACES

ROBOT GRIPPER FOR INTEGRATED CIRCUIT LEADFRAMES

TECHNICAL FIELD

The field of the invention is that of automated assembly of integrated circuits, in which fragile objects must be gripped and moved by mechanical devices.

BACKGROUND ART

It is known to use manipulation grippers for material handling with gripping pressure supplied by springs, hydraulic pressure or the like. Such grippers are not suitable for handling thin sheets of material because they exert too much force.

Handling thin sheets is often done with a vacuum gripper, but vacuum devices only work with solid sheets, not with perforated ones, because perforations prevent a vacuum from being maintained.

The problem addressed by this invention is that of picking up, moving and disengaging a thin, fragile sheet having too many perforations for vacuum devices to be used.

DISCLOSURE OF INVENTION

The invention relates to an apparatus for gripping flexible sheets mechanically without exerting substantial pressure in the plane of the sheet; moving the sheet to an aligned position and then disengaging the gripping fixture from the sheet.

BRIEF DESCRIPTION OF DRAWINGS

FIG. 2 illustrates the steps in FIG. 1 in more detail.

FIG. 6 illustrates a carrier used to hold a leadframe and die during the bonding step.

BEST MODE FOR CARRYING OUT THE INVENTION

The present invention was developed together with other components of a system for assembling and testing integrated circuits. Other features of the system are the subject of co-pending patent applications, filed the same day herewith and assigned to the assignee hereof. In order to convey the invention in context, discussion of the overall system is included in this specification.

Figure 1:
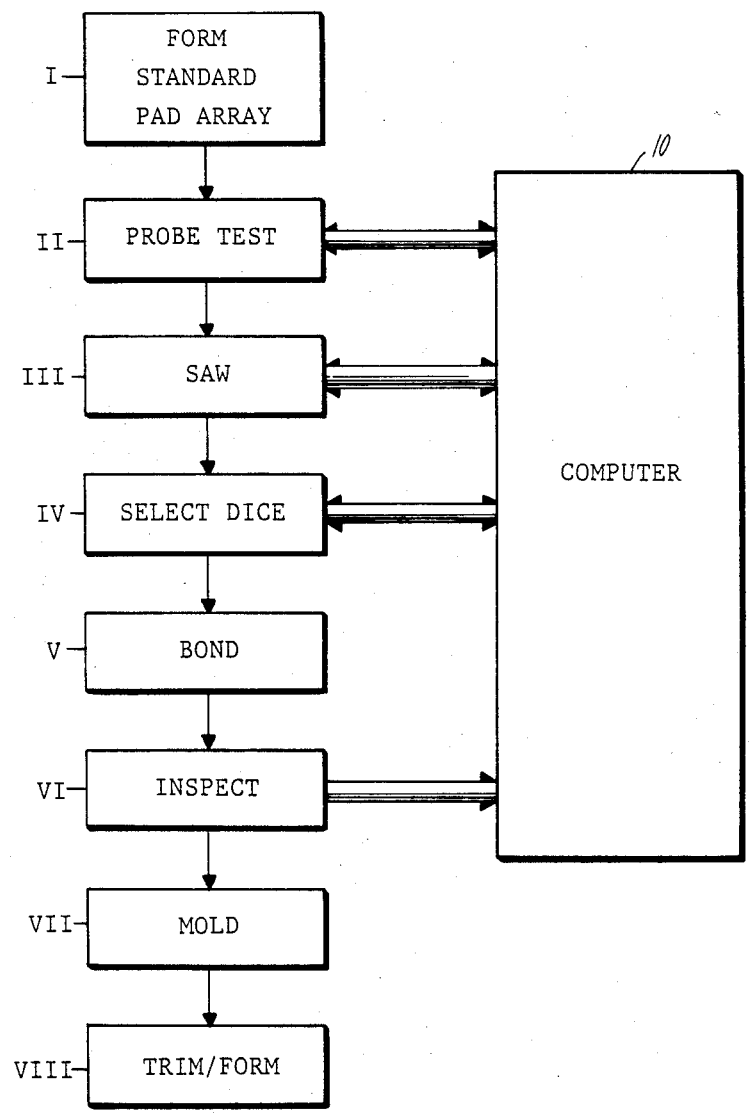
FIG. 1 illustrates the process flow in the subject invention.

An overall flow chart of the steps used in the back-end assembly is illustrated in FIG. 1, in which a number of steps are illustrated schematically and are performed by a variety of different machines in communication with and sometimes controlled by a computer for storing test and other data.

In the first major step, represented by the box labelled I, a process that may be part of the "front-end" or the "back-end", accepts as input a wafer that has been completed with all the conventional steps (including passivation - etc.) and applies a further layer of dielectric having a thickness sufficient to protect the chip circuits and to insulate them electrically from signals being carried on the top surface of the dielectric.

A pattern of metal leads is formed that extends from the contact pads on the previous chip to a standard array of contact pads on the top of the dielectric. The standard array is the same for all chips having the same number of pins, regardless of the size of the chip die.

The wafer is then probe tested, in major step II with the results of the probe test being stored electrically, such as in a computer. The conventional ink-dot marking system for bad chips is not used.

The wafer is then adhesively mounted on an adhesive film in a frame holder that is shaped to allow for automatic insertion and orientation in various fixtures further along in the process and cut apart in an automatic sawing process (Step III) that cuts through the entire thickness of the wafer.

The good dice are then removed from the wafer in an automatic sequence (Step IV) that presses from above against the tape to selectively pick a die down into a dedicated carrier where it rests circuit side down. This is not a problem since the active circuitry is protected by the standard pad dielectric and standard pads. The wafer and punch-out device are moved under computer control to put the dice into the correct positions in the carrier.

The dice are transferred to a mating carrier simultaneously in an inversion operation that rotates the two-carrier "sandwich" by 180 degrees, so that the dice resting in the second carrier have contacts on the top side. A set of dice are transferred to a bonding fixture that holds a convenient number, illustratively 14 dice. Once loading is complete, a leadframe matching the spacing of the dice in the fixture is positioned above the dice in the soldering fixture and an upper bonding fixture is added to maintain lead to pad contact during the bonding process.

The bonding fixture is heated to reflow the solder and form the interconnection (Step V).

The leadframe with dice attached is placed in a transfer or injection molding machine that encapsulates the die together with the interconnections to the leadframe (Step VI).

The molded strip of devices is then trimmed and formed conventionally (Step VII).

There is a representation in FIG. 1 of data communication between the machines that perform the steps listed above and the controlling computer. Most data communication steps are optional. The step may indeed be performed under operator control and data may be written down manually. The benefits of automatic recording of data and error-free recall of data from a previous step will be evident to those skilled in the art.

FIG. 2 sets out the steps in FIG. 1 in more detail and also illustrates the material and data flow. A convention used in this figure is that a broken line indicates a material transport step of the sort of loading the material into a container and moving the container to another location and a double arrow indicates data flow into or out of a computer or other storage device. The three material inputs to the process are the wafers, leadframes and plastic for encapsulation. Two recirculation loops involve, respectively, a frame used to support the wafers during the sawing and die selection steps and a positioning fixture used to maintain a set of dice in alignment with a leadframe segment during the bonding operation.

The different steps of the invention are set forth in more detail below and in copending patent applications filed on the same date herewith and assigned to the assignee hereof.

STANDARD CONTACT PADS

Returning to the first major step, the illustrative dielectric layer is a polyimide such as Dupont 2525 applied with the thickness of 6 microns and cured at a temperature of greater than 260 C. There may be a nitride or other layer below the polyimide to improve adhesion to the reflow glass or other top layer. The electrical contact pads that have been previously formed in the integrated circuit chip by conventional processing techniques are exposed by applying a photoresist, either liquid or in the form of a tape, on top of the dielectric and etching down through it a passageway to the metal contact pad in the circuit in a conventional manner. A "via" will be formed by filling the contact holes with a metal or other conductor until the surface of the dielectric is reached. The photoresist is stripped off and a layer of metal is applied by any technique, such as sputtering, over the surface of the polyimide. In one example, the polyimide was back sputtered to prepare the surface, after which 600 Angstroms of 10% titanium +90% tungsten followed by 3 microns of copper were sputtered on. A second layer of photoresist is applied and patterned to define a set of metal leads in the metal layer. The leads reach from the vias penetrating the dielectric to an area in the center of the chip which has a standard pad array of pad contacts that is the same for all the chips that have the same number of leads. For example, a 16 pin chip will have the same standard pad array, of size about 0.016" by 0.016" in a standard configuration having dimensions of 0.126" by 0.126", whether it is a memory or any other logic device. The standard pad array will be sized so that it fits on the smallest chip that is to be used with that leadframe. Optional versions of the invention employ a pad array that is arranged for some particular purpose.

The exposed areas of the metal are plated with a solder composed of a standard mixture of lead and tin in a conventional electrolytic plating process that employs a mixture of 95% tin and 5% lead. The photoresist is stripped and the plated areas of the metal layer are used as an etching mask in the next step in which the remaining unwanted area of the metal layer is etched away in a bath of hydrogen peroxide plus ammonium hydroxide followed by hydrogen peroxide, which does not attach the solder.

Figure 3A:
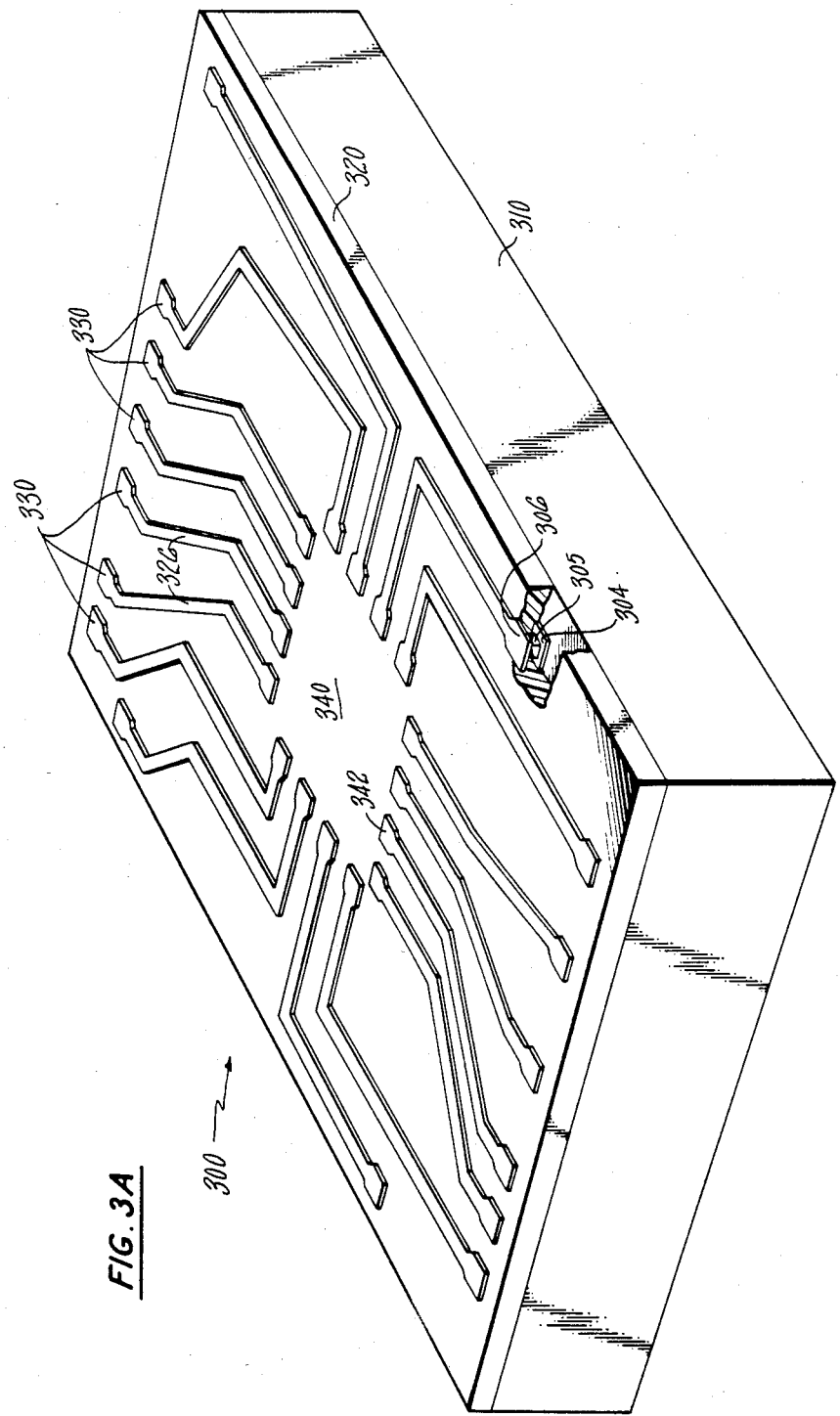
FIGS. 3A and 3B illustrate different forms of a chip used in the subject invention.

There now remains a chip 300 of the form illustrated in FIG. 3A, in which die 310 has on it a thick layer of polyimide 320 and a network of metal lines 326 leading from the contact areas 330 on the outside of the chip to the standard pad array 340. The metal lines 326 have lower inductance greater thermal conductivity and greater strength compared to the wires that were previously used.

In the example shown in FIG. 3A, the first contacts and the vias through the polyimide layer are all formed on the perimeter of the chip. This figure illustrates a chip in which the layout design was made for the old wire-bonding method in which the contact areas had to be on the perimeter of the chip. An advantage of retaining the old design, besides saving the expense of a new layout, is that it is possible to use conventional wire-bonding processes when added capacity is required. To do this however, requires that the additional dielectric and metallizations for the standard pad process is not used.

Figure 3B:
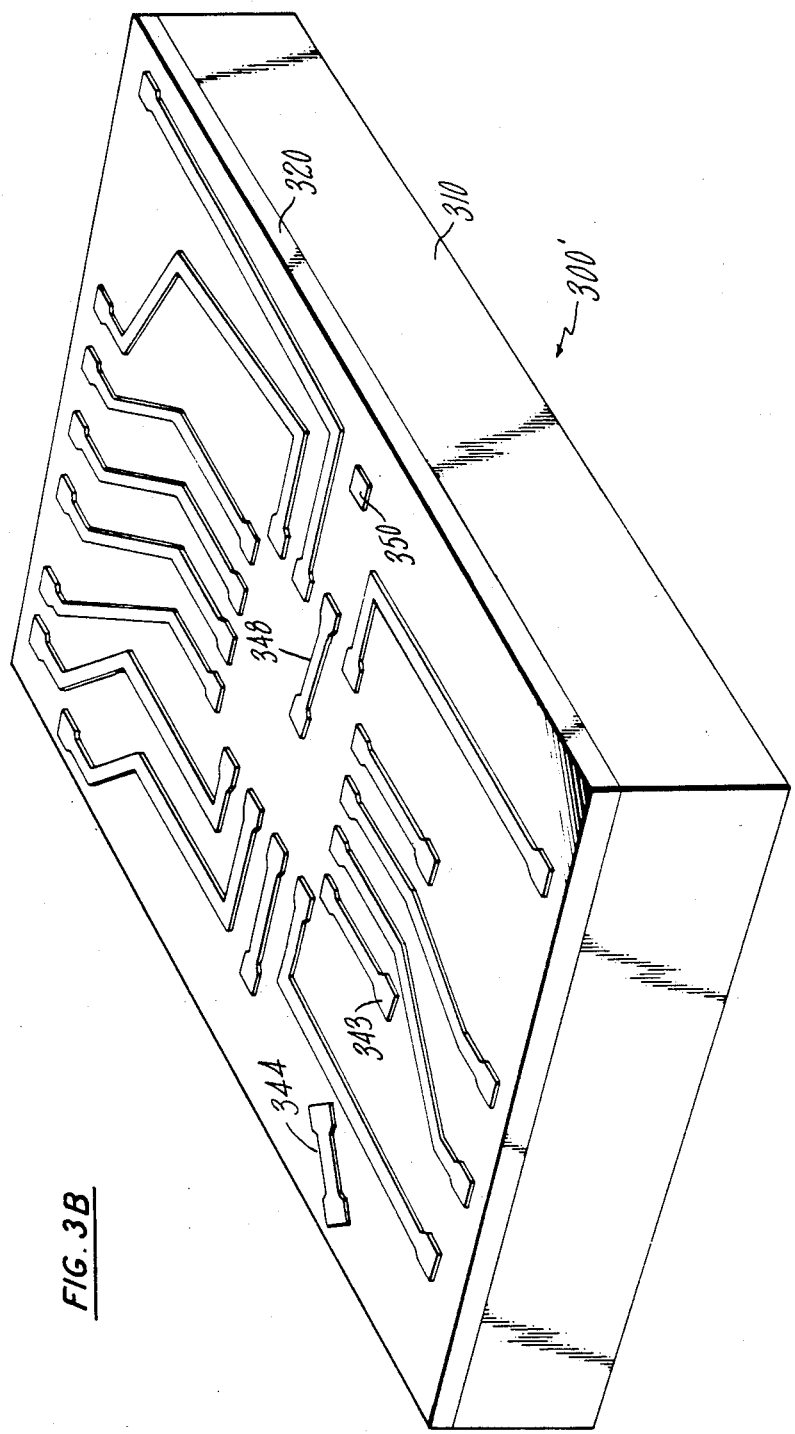

It is also possible to put the contact areas through the dielectric at any convenient location, as shown in FIG. 3B. The vias for these leads are shown as originating at different locations on the chip surface, not exclusively at the edge as was the case in the prior art. Lead 348 is shown as connecting a via that is located within the standard pad array. Lead 343 is connected to a via-section 344 through a bridge, not shown in the drawing, that is placed on top of the passivation layer of the underlying chip below the polyimide. This illustrates an additional degree of freedom in routing leads and placing components that is provided by the invention.

A via 305 is shown in FIG. 3A in a cut-away portion of the figure as extending from a lower contact area 304 to an upper contact 306 at an end of one of leads 326. The lower contact pads in current practice are typically 4 mils by 4 mils. With such a large area to make contact, the alignment tolerance for the formation and location of the vias and the placement of leads 326 are typically ±2 mils to 3 mils, which is much greater than a typical tolerance of ±½ mil to 1 mil for connecting leads in the precision processes that are used with conventional wirebonding.

The steps of forming vias and putting down leads may be performed in the front-end using the standard machines for photolithography, if that is convenient. Since the requirements for putting down these metal leads are much less stringent in position alignment than the usual front-end work, it may be preferable to use thick-film technology, such as screen printing, to pattern the dielectric and top leads. Typically, the thick-film technique will be ¼ to ½ the cost of the precision techniques.

Figure 4:
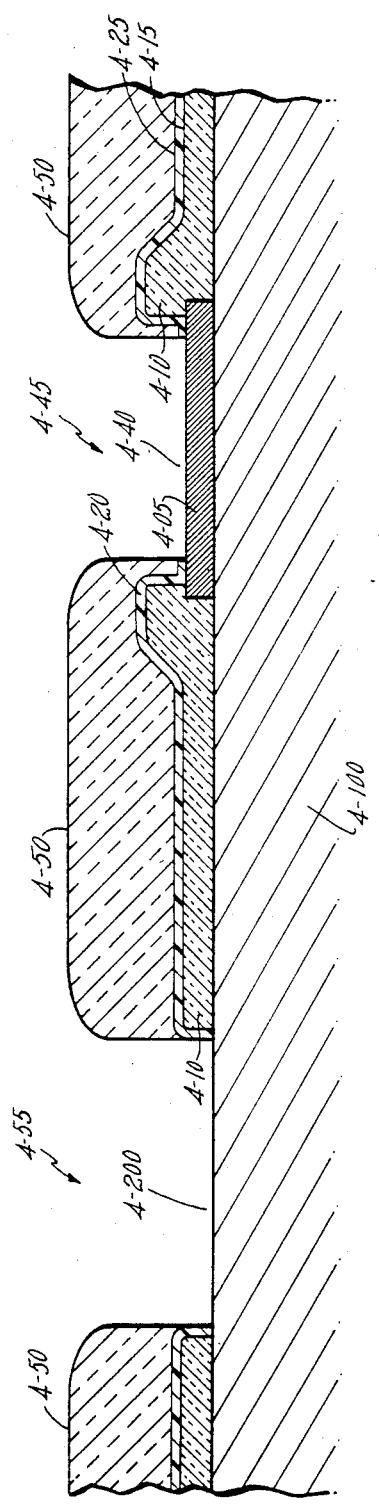
FIG. 4 illustrates a cross section of a die used in the invention.

It has been found that the polyimide layer 320 of FIG. 3 does not adhere reliably if it is attached directly to the layer of oxide immediately below it. A cross section of a portion of a die is shown in FIG. 4, in which substrate 4-100 is the silicon substrate and aperture 4-200 is the "street" that separates adjacent dice. The width of a street is typically 100 microns, to allow room for the saw kerf in the separation step that is performed with a diamond saw having a width of 0.001 inch.

A contact pad, 4-05, is shown with a series of apertures defined above it. Pad 4-05, which is typically aluminum and is connected by metallization strips, not shown, to the rest of the circuit, is surrounded by oxide 4-10, which has a conventional composition of $SiO_2$ plus phosphorous and other additives and a thickness of 1 micron. Oxide 4-10 has a top surface 4-15 on which polyimide layer 4-50 was, at first, applied directly. Early tests showed significant difficulty, in that polyimide layer 4-50 (layer 320 in FIG. 3) often disbonded, causing the leadframe to pull the polyimide away from the underlying layer.

Oxide 4-10 functions as the top dielectric layer in the circuit. It not only coats the substrate and contacts, as shown in FIG. 17, but also the circuit elements and metallization.

Passivation of the active elements of the circuit is effected in the usual manner of silicon MOSFETS by the thin oxide over source, drain and active area so that oxide 4-10 functions purely as a dielectric, not as a passivating layer.

Nitride layer 4-20 is deposited by plasma-assisted CVD at a temperature of 250 C, in a conventional manner, to a thickness of 0.3 micron after street 4-200 has been etched through oxide 4-10 to the substrate. A layer of 2525 polyimide from Dupont is applied and spum to produce a relatively flat top surface. Apertures 4-45 above contact 4-05 and 4-55 above street 4-200 are opened through the uncured polyimide by wet etching with a conventional basic solution such as Shipley 312 developer. Typical dimensions for the top of aperture 4-55 and 4-45 are 100 and 87 microns, respectively. After aperture 4-45 has been opened, aperture 4-40 is opened through nitride layer 4-20 by plasma etching in CF4. A typical dimension of aperture 4-40 is 75 microns, so that aperture 4-40 is surrounded by nitride 4-20 and does not expose any of oxide 4-10.

It has been found that the adhesion of polyimide to top surface 4-25 of nitride 4-20 is greatly improved over the adhesion of polyimide to oxide 4-10 at surface 4-15. Nitride 4-20 adheres well to oxide at surface 4-15. the function of nitride 4-20 is thus to improve the adhesion of the polymide by means of a structure that totally encloses the oxide 4-10, not only at the vias but also at the saw cuts on the streets.

BOND

The assembly for the final bonding step (Step V in FIG. 1 and Leadframe Fixture Assemble, Bond, Disassemble in FIG. 2) is shown in an exploded view in FIG. 6, in which holder 6-110, represented schematically, holds 14 chips with the correct spacing, only two of the receptacles 6-225 being shown. Above receptacle 6-225, there is positioned chip 6-230 and, above the chip, a set of finger contacts 5-122 in leadframe 5-100, part of leadframe strip 5-125. The details of the leadframe will be described below. Cover 6-120 presses down on edge 5-110 of leadframe strip 5-125, which edges rest on shelves 6-112 to position the outer parts of the strip so that the contact tips will be deflected slightly. This deflection is done to compensate for inevitable fluctuations in the position of the tips during the manufacturing process, so that reliable contact is ensured during the bonding operation. The deflection is effected by making the depth of receptacle 6-225 such that the top of chip 6-230 projects above the plane of shelves 6-112 by a set amount. The amount of deflection, (0.005 inch to 0.007 inch) is illustratively several standard deviations of the nominal fluctuation of the tip position to ensure reliable joint formation. The edges 5-110 of leadframe strip 5-125 will be forced on to shelves 6-112 by cover 6-120 and tips 5-122 will thus be pressed against the pads by the spring constant of the leads.

Figure 5:
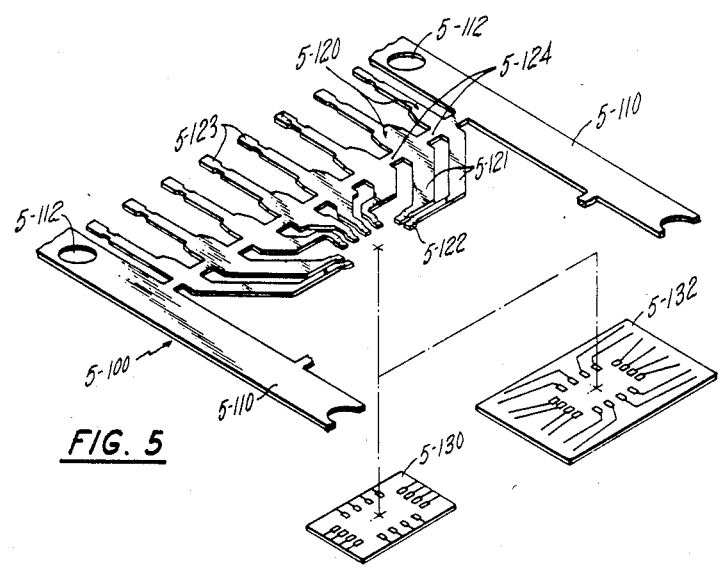
FIG. 5 illustrates a portion of a leadframe.

A typical leadframe used in the invention is illustrated in FIG. 5, in which half of an individual frame is shown. The individual leadframes are stamped out of a ribbon of metal that may be an inexpensive copper alloy, in contrast to the expensive alloy having the correct thermal properties that is used in the standard prior art process. Strips 5-110 on either side of the ribbon serve to carry the actual leads 5-120 along. Leads 5-120 have an exterior end 5-123, shaped either for insertion in a socket or for surface-mounting, and an interior portion 5-121 for attachment to a die. The two portions are joined by segments 5-124 that will be severed after the bonding step. Holes 5-112 are provided to give a reference in positioning the leadframe. At the end of each lead segment 5-121, there is a region, 5-122, in which the lead is bent in a quarter circle (or bent twice to form a parallel contact section) to form a standard dimension flat contact area. Each of the different lead segments 5-121, with its different length, has been shaped to provide substantially the same spring constant so that the contact areas 5-122 will be uniformly pressed against the mating pads on the die to give correct alignment for the soldering operation. The leads 5-120 have been tinned with solder in a previous step in the fabrication of the lead frame ribbon.

It is an advantageous feature of the system, but not an essential one, that a family of chips that have the same number of pins have the same standard pad array on top of the dielectric. For illustration, two dice 5-130 and 5-132 of different size are shown together with the leadframe. With this feature, it will then be necessary to have only one ribbon of leadframes for the entire family of chips, with substantial savings in inventory.

Both the contact pads 342 of the die and the tips 5-122 have been tinned and are ready to be heated. The bonding is done by a vapor phase reflow soldering technique or other means of heating the materials to reflow the fusible alloys. These alternative techniques include infra-red heating, conveyor ovens, hot gas heating or laser heating. In vapor phase reflow, a liquid such as Flourinert FC-71 is maintained at its boiling point, the liquid having been selected so that its boiling point is above the soldering temperature. The soldering assembly of holders 6-110 and 6-120, with chips plus leadframe maintained in alignment, is inserted into a container or oven that is filled with the vapor at the boiling-point temperature and held there until the solder has melted and flowed to form a bond. A typical length of time for the heating cycle is 5 to 15 seconds. This boiling point temperature is typically above 225 degrees C. but below 300 degrees C. In contrast, the present wire bonding and die attach steps are performed at temperatures of up to 460 degrees C. and performed individually. In order to reduce the length of the heating cycle, the bonding fixture should have low mass and many apertures to permit the vapor to flow freely about the solder joints. Holders 6-110 and 6-120 have been shown schematically in order to reduce the complexity of the drawing.

An important economic benefit of this invention is that all the leads are soldered at the same time. This is in contrast to the wire-bonding technique, in which the leads must be bonded one by one. The soldering step takes no longer for a 28 pin chip than it does for a 16 pin chip.

MOLD

In the next major step, (Step VII in FIG. 1), leadframe 5-100, with 14 chips attached, is placed into a transfer or injection molding machine to mold plastic about it, thus encapsulating and protecting the chip. The molding process will be done using conventional techniques and equipment. It is an advantageous feature of this invention that the wide contact area between the leadframe and the contact pads is extremely rugged compared to the wire bonding technique that is in standard use so that a far smaller fraction of chips will be damaged during handling and the chips can be moved about at a greater rate and with less delicacy required. It is a further advantage that the leads conduct heat away from the chip during operation.

After the encapsulated dice, (still in the leadframe) are removed from the molding machine, the optional labelling step of FIG. 2 is performed. The dice identity first appeared during probe test, when data were measured that applied to an individual die. That identity was preserved by the labels on the wafer, tape frame and leadframe, the computer being updated as required to log the die identity on the leadframe. Each chip may be marked by a laser branding process or any other convenient techique with an identifying label, test results, etc.

The conventional "dejunk" step, in which excess plastic is removed from the leads is also performed at this time.

TRIM/FORM

Next, in step VIII of FIG. 1, the chip plus leadframe combination is separated from the ribbon and the spacing segments 5-124 that served to maintain the leads in correct alignment are severed. If the ribbon is formed from a sheet of copper or copper alloy, it is necessary to sever the connections 5-124 or else all the leads will be shorted together. If another version of the ribbon is used, in which a plastic backing is used for the portion 5-110 and to support leads 5-120, on top of which a plated copper lead has been formed, then it will be easy to maintain the sections 5-124 in plastic and it is not necessary to separate the leads.

LEADFRAME DETAIL

Figure 7A:
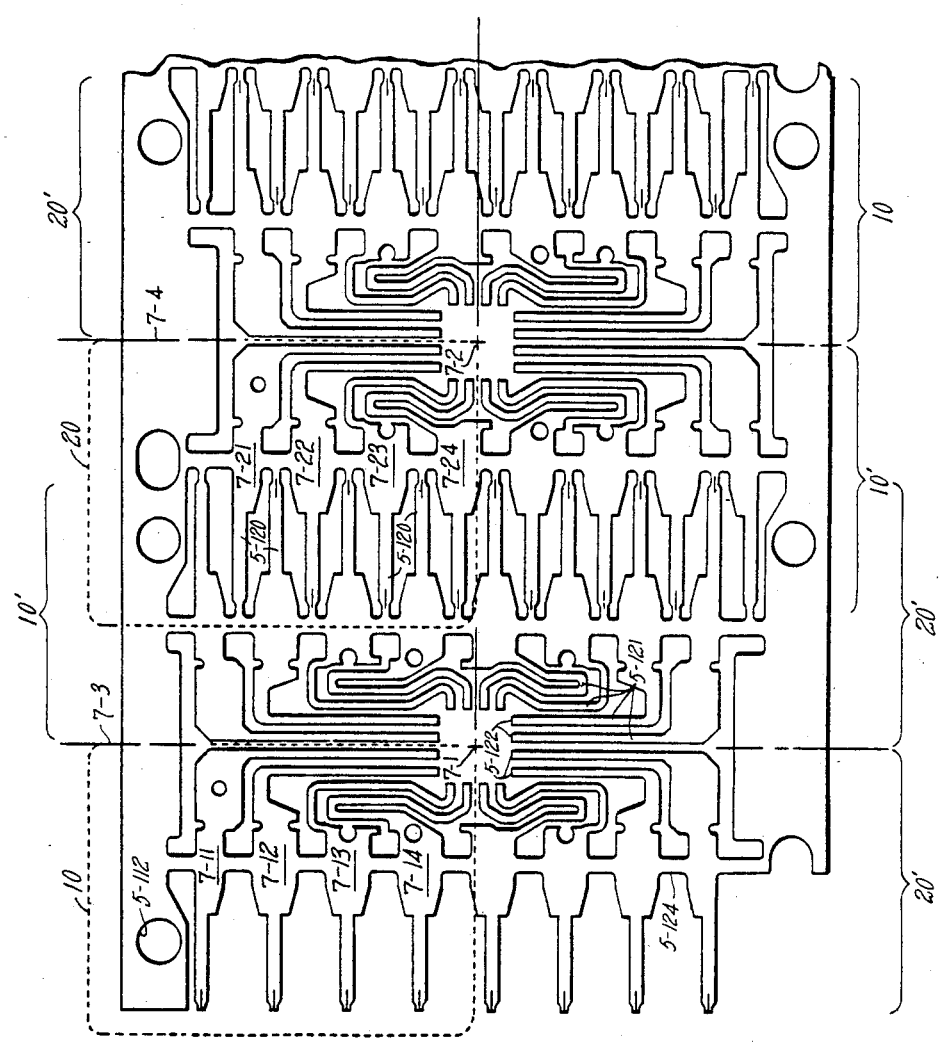
FIGS. 7A–7C illustrate a leadframe design suitable for 16-pin dice.
Figure 7B:
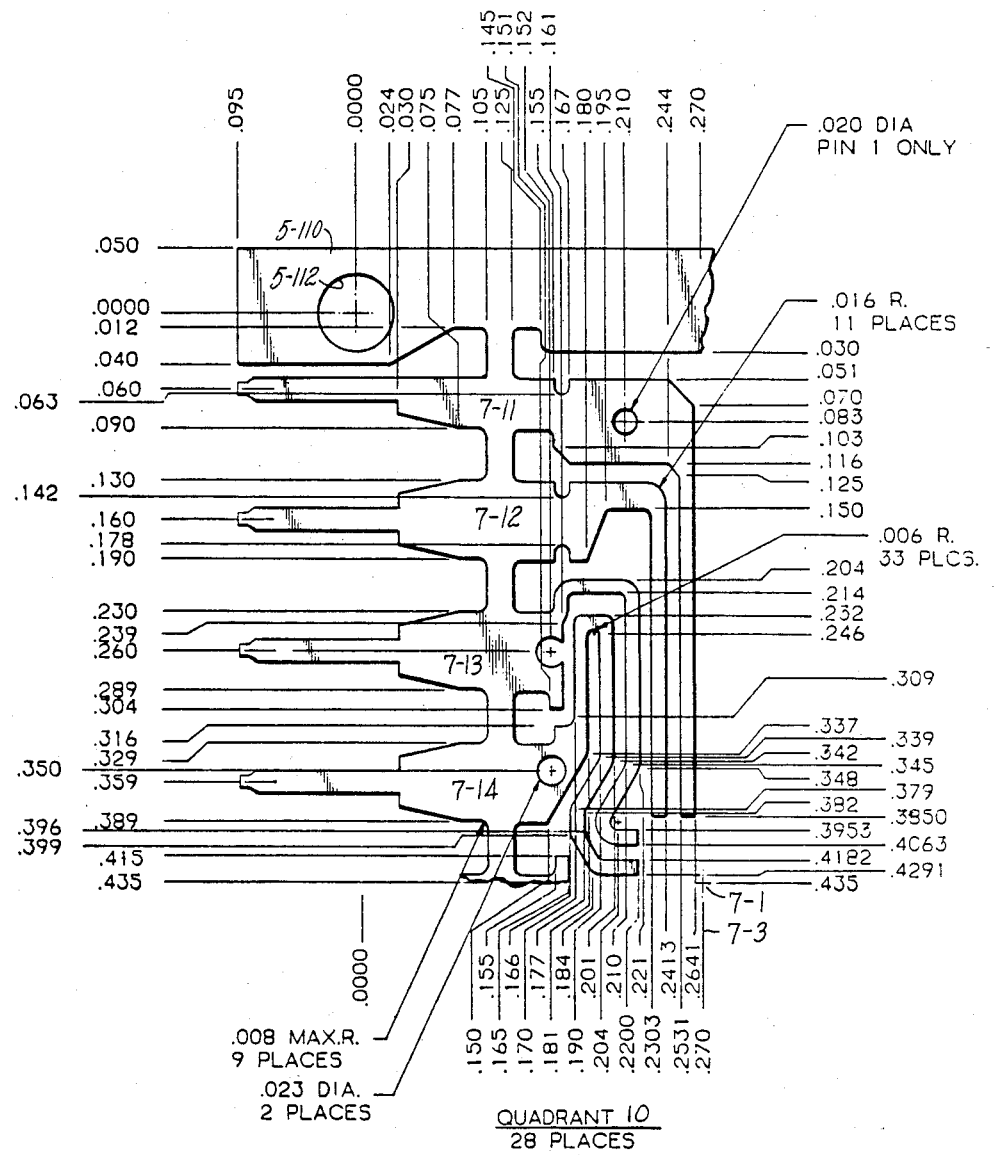
Figure 7C:
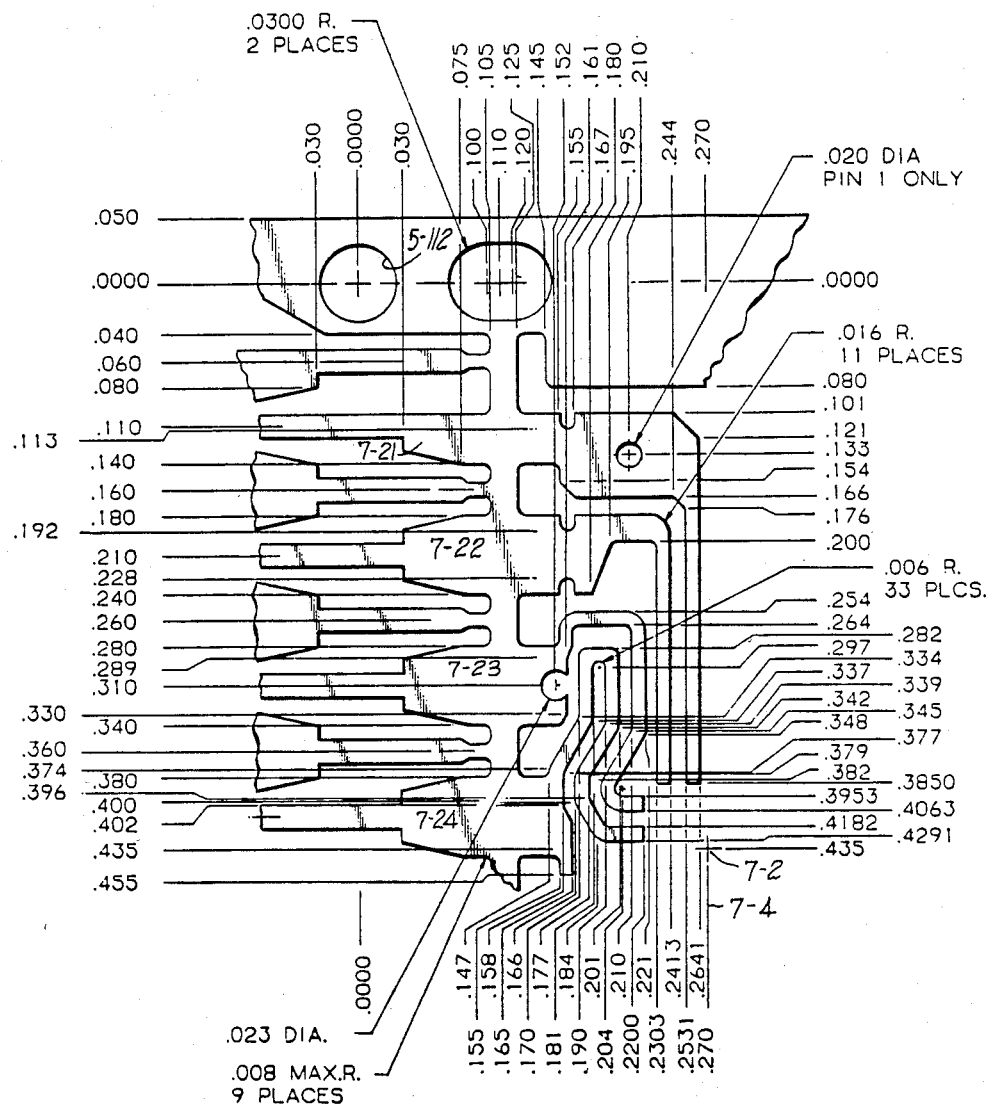

The illustration in FIG. 5 is general in nature, for the purpose of illustrating the broadest version of leadframe to die bonding principles usable in the invention. More leadframe detail is shown in FIG. 7, in which FIG. 7A is a top view of a portion of a leadframe strip containing two leadframes centered on points 1 and 2 respectively.

The figure is crowded because of one advantageous feature of the invention, which is that the exterior portions 5-123 of adjacent leadframes overlap ("interdigitated" in conventional terminology), thus reducing the amount of scrap that is produced when the leads are stamped or etched out of the metal ribbon. It would also be simple to overlap the portions 5-123 by offsetting every other leadframe by one half the distance between leads 5-120, but then the chip location in the fixture would also have to be offset, which would make the die loading into the fixture process more complex.

Each 16-pin leadframe is formed from four quadrants 10, 10', 20 and 20'. Quadrants 10 and 10', are mirror images reflected through centerlines 7-3 or 7-4; as are quadrants 20 and 20'. The difference between quadrants 10 and 20 is the shape of fingers 5-121 that extend from joining strips 5-124 to contact pads 5-122 of the individual leads. Two sets of four leads 7-11 to 7-14 and 7-21 to 7-24 are shown in FIG. 7A and in more detail in FIGS. 7B and 7C, respectively.

In order to show the most complete details of the leadframe, the pertinent portions of working drawings have been reproduced. The numerals with a decimal point are dimensions in inches in a rectangular coordinate system having its origin at the center of hole 5-112. For example, finger 7-11 of quadrant 10 has a width of 0.2641 inch–0.2531 inch or 0.011 inch and is separated from finger 12 by 0.2531 inch–0.2413 inch or 0.012 inch.

Fingers 5-121 have been designed to have the same spring constant; in this embodiment 0.025 mm deflection for 981 dynes, (1 to 2 grams force per 1-mil of deflection) in order to ensure reliable contact between finger tip 5-122 and pad 342. Tips 5-122 are formed by bending fingers 5-121 with a radius of curvature of 0.010 inch, resulting in a contact tip that is nominally 0.01 inch square.

The particular leadframe illustrated has external leads 5-120 conforming to industry standards for a 16-pin D.I.P. The material is OLIN 195, ¾ hard, with thickness 0.010+0.0005 inch before plating. The solder plating is tin-lead 200–350 microinches thick, with a tin content between 88% and 98%, the balance lead.

Centerlines 7-3 and 7-4 of FIG. 11a are separated by 0.540 inches, resulting in a set of 14 leadframes that has an overall length of 7.75 inches.

Many other designs for fingers 5-121 can be made by those skilled in the art in the light of this disclosure. It is not essential for the practice of the invention that fingers 5-121 have exactly the same spring constant and substantial variation is permissible.

In the process of bonding leadframes to dice, a leadframe input station holds an accumulation of leadframes and presents them to a robot, illustratively a Seiko PN-100, that places a 14-chip leadframe above the dice in lower bond fixture 6-120. The station may be simply a magazine of precut leadframe strips or it may be a roll of leadframes with a cutting mechanism. In the magazine embodiment, a magazine is sequentially raised to an input level, and the precut strips are ejected by an air blast.

Handling the leadframes presents a difficult challenge. They are fragile and would easily be crushed by conventional grippers. Grippers with "tactile" sensors might be used, but they are expensive. Vacuum lifters cannot be used because of the many apertures in the leadframe.

Figure 8A:
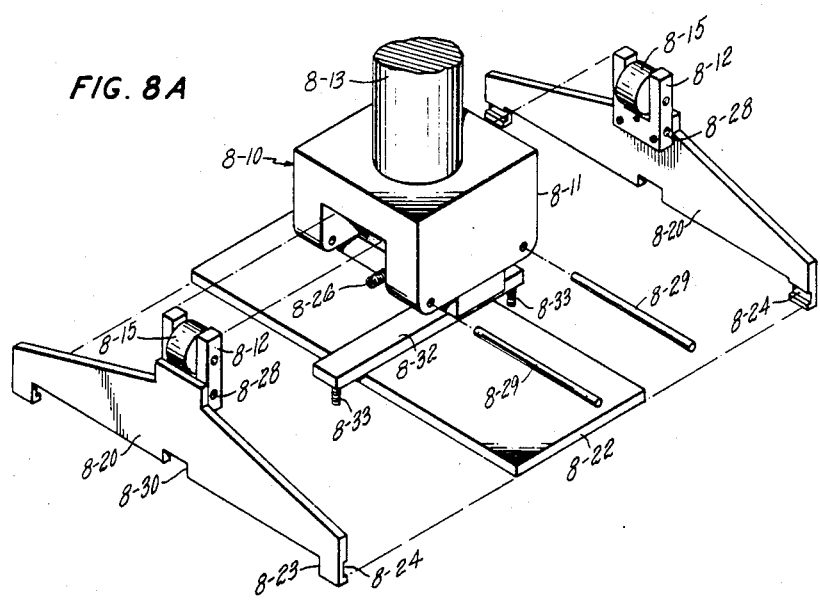
FIGS. 8A and 8B illustrate a gripper mechanism for the leadframes.
Figure 8B:
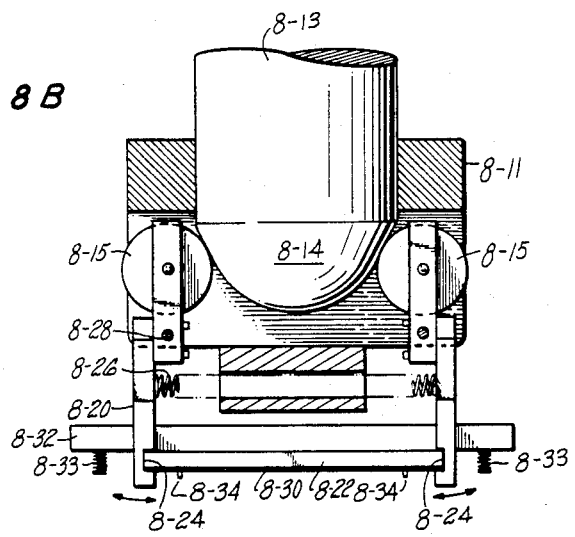

FIGS. 8A and 8B illustrate an economical gripping fixture that handles the task of lifting and aligning the leadframe. FIG. 8A is an exploded view of FIG. 8B is a side view of an assembled fixture. Referring now to FIG. 8B, the principle that has been adopted is the use of a "back-up bar" 8-22 to relieve the pressure that gripping fixtures 8-20 would otherwise exert. The force arises from spring 8-26, shown as connected between grippers 8-20 and pressing them apart. Other springs in different locations or other methods of exerting force may also be used.

Leadframe 8-30 is located below bar 8-22 and between notches 8-24 in extensions 8-23 of gripping fixtures 8-20. As can be seen in FIG. 8A, there are four notches or gripping areas 8-24. There is a nominal clearance of 0.015 inch between the bottom of bar 8-22 and the bottom of notch 8-24. Since leadframe 8-30 is only 0.010 inch thick, there is a margin of 0.005 inch.

Gripping bars or fixtures 8-20 pivot about pivots 8-29 in response to downward pressure from cone 8-14 on rollers 8-15 attached to fixtures 8-20. Cone 8-14 is illustratively part of a commercially available air actuated cylinder with spring return, 8-10, available from the Seiko corporation. Housing 8-11 encloses cylinder 8-13, having cone 8-14 on the lower end, and provides support for pivots 8-29 through hole ends 8-28 that are disposed from the axis of cylinder 8-13 on arms 8-12. There are four hole ends 8-28 that support both ends of each pivot 8-29. Housing 8-11 also supports bar 8-22 through a rigid support that is omitted from FIG. 8 for clarity. The motion of gripping fixture 8-20 is indicated by the arrows in FIG. 8B.

It is not necessary for the practice of the invention in its broadest form that a linear motion be converted to the angular motion of gripper bars 8-20. Alternatively, solenoid actuators could displace bars 8-20 parallel to the plane of backup bar 8-22.

Slots 8-30 in fixtures 8-20, visible in FIG. 8A, provide clearance for spring-loaded plungers 8-33, shown schematically in the figures, as being supported by support bar 8-32 fastened to backup bar 8-22. The function of plungers 8-33 is to press against lower bond fixture 6-110 to prevent backup bar 8-22 from being held by its alignment pins to the bonding fixture.

Two alignment pins, 8-34, are shown in FIG. 8B. Pins 8-34 are located on diagonally opposite corners of bar 8-22 in order to locate bonding fixture 6-112 with respect to bar 8-22. This alignment does not align the leadframe with respect to the bonding fixture or with the dice because the holes in the leadframe through which pins 8-34 pass are oversized. That alignment is effected by pins in the bonding fixture, not shown in the drawing, that enter selected holes in the leadframe. The bonding fixture, leadframe and gripper combination must be within a tolerance range before the alignment pins in the bonding fixture will enter the proper holes in the leadframe, of course, and that is the function of pins 8-34. There will always be errors in the exact location of pins and holes and pins 8-34 may bind in their mating holes. Plungers 8-33 are used to ensure disengagement of pins 8-34 from the bonding fixture. Leadframe 8-30 remains with the bonding fixture because the holes in the leadframe through which pins 8-34 pass have a looser tolerance than the four holes that mate with alignment pins in the bonding fixture. The combination of four pins and tighter tolerance ensures that leadframe 8-30 is held fast when the gripper is lifted.

Upper bond fixture 6-120 is then placed above the leadframe to press it down for good bonding contact as described above. Illustratively, magnetic attraction between magnets and magnetic material in the upper and lower fixtures is used to maintain the bonding fixture in correct alignment during the bonding process.

The completed bonding fixture is placed on a conveyor that is part of an HTC Corporation IL-12 vapor phase heating system using Fluorinert FC-71 as a heat transfer medium. The bonding fixture passes through the system at a rate of speed that is adjusted to provide adequate heating for reliable bonding, typically spending 5-15 seconds within the vapor zone.

The bonding fixture is then disassembled, with the bonded leadframe being removed by another gripper constructed according to the invention; the leadframe being passed on to the molding process described above and the bonding fixtures being returned for reuse.

Those skilled in the art will readily be able to construct different embodiments of the invention that has been described above. The illustrative embodiment was activated by compressed air, but liquid hydraulic operation or electric solenoids may also be used.

There may be two small claws on either side of the gripping bar, as shown; or there may be a single wide claw on each side; or there may be more than two claws on each side, as is convenient. The backup bar need not be a continuous single member extending the length of the leadframe. One or several stops could be used, placed in any convenient location. The backup bar need not be located close to the object being gripped, in a vertical direction.

We claim:

1. Apparatus for gripping a thin flexible object located substantially in a gripping plane having a transverse axis and a longitudinal axis, said transverse and longitudinal axes being perpendicular to each other and to a linear axis perpendicular to said gripping plane comprising:

first and second sets of gripper claws gripping said object, said sets of gripper claws being located on opposite sides of said longitudinal axis and having a closed position for gripping said object and an open position for releasing said object;

means for restricting the motion of said gripper claws in a direction perpendicular to said longitudinal axis, so that said gripper claws approach said longitudinal axis no closer than a predetermined transverse distance;

means for moving said griper claws inwardly to said predetermined transverse distance to define a gripping volume bounded by said gripping claws in said gripping plane along said transverse axis and bounded in a direction parallel to said linear axis by top and bottom volume bounding means; and means for moving said gripper claws outwardly from said predetermined transverse distance to release said object;

said bottom volume bounding means comprising a lower projection portion of said first and second sets of gripper claws extending inwardly toward said longitudinal axis to a lower predetermined distance less than said predetermined transverse distance, said gripper claws further including an upper projection portion extending inwardly toward said longitudinal axis;

said means for restricting the motion of said gripper claws comprising a planar member located between said upper and lower projection portions of said gripper claws and having a lower surface disposed above said gripping plane along said linear axis, whereby said gripping volume is defined by said lower surface, said lower projection portions and said griping claws.

2. An apparatus according to claim 1, in which said lower surface has at least one securing pin projecting downwardly for engaging a corresponding securing hole in said object, thereby preventing said object from sliding along said longitudinal axis in said gripping plane.

3. An apparatus according to claim 1, in which said means for moving said gripper claws rotates said first and second sets of gripper claws about corresponding first and second pivots disposed a greater distance from said gripping plane along said linear axis than said lower surface of said planar member.

4. An apparatus according to claim 1, in which said means for moving said gripper claws translates said gripper claws in said gripping plane toward said longitudinal axis.

5. Apparatus for gripping a thin flexible object located substantially in a gripping plane having a transverse axis and a longitudinal axis, said transverse and longitudinal axes being perpendicular to each other and to a linear axis perpendicular to said gripping plane comprising:

first and second sets of gripper claws gripping said object, said sets of gripper claws being located on opposite sides of said longitudinal axis and having a closed position for gripping said object and an open position for releasing said object;

means for restricting the motion of said gripper claws in a direction perpendicular to said longitudinal axis, so that said gripper claws approach said longitudinal axis no closer than a predetermined transverse distance;

means for moving said gripper claws inwardly to said predetermined transverse distance to define a gripping volume bounded by said gripping claws in said gripping plane along said transverse axis and bounded in a direction parallel to said linear axis by top and bottom volume bounding means; and means for moving said gripper claws outwardly from said predetermined transverse distance to release said object;

said bottom volume bounding means comprising a projection portion of said first and second sets of gripper claws extending inwardly toward said longitudinal axis to a lower predetermined distance less than said predetermined transverse distance;

said means for restricting the motion of said gripper claws comprising a planar member having a lower surface disposed above said gripping plane along said linear axis, whereby said gripping volume is defined by said lower surface, said projection portions and said gripping claws;

said lower surface having at least one securing pin projecting downwardly for engaging a corresponding securing hole in said object, thereby preventing said object from sliding along said longitudinal axis in said gripping plane; and disengaging means for exerting force along said linear axis between said apparatus and a receiving apparatus in order to disengage said object from said securing pin.

6. Apparatus for gripping a thin, flexible object comprising:
(a) linear motion means for controllably moving a linear motion member in two directions along a first linear axis;
(b) pivot means for translating motion along said first axis to rotational motion about first and second pivots having first and second parallel pivot axes displaced from said first linear axis by a pivot displacement along a first transverse axis and at right angles to said first axis;
(c) first and second gripper bars, extending parallel to said first and second pivot axes, for applying said rotational motion at first and second gripper areas, said gripper areas being located in a transverse gripping plane perpendicular to said first linear axis and being offset from and on opposite sides of said first linear axis by equal distances along said first transverse axis;
(d) first and second sets of gripper claws attached to said gripper bars such that said gripper claws are located in said gripper areas when said apparatus is in a closed position.
(e) a backup bar mounted perpendicular to said first linear axis, having a bar thickness along said linear axis and having transverse edge dimensions along said first transverse axis such that the transverse edges of said gripper bar mate with said gripper claws in said closed position, each of said gripper claws pressing against said transverse edge of said backup bar and having a gripper opening extending downwardly along said first linear axis by a thickness amount and extending parallel to said first transverse axis inwardly toward said first linear axis by a gripping distance, whereby a thin object located adjacent the lower surface of said gripper bar, having a thickness less than said thickness amount and a transverse dimension along said first transverse axis less than said bar width and greater than the bar width minus twice the gripping distance may be confined by said gripper claws;
(f) the operation of said first linear motion means being restricted by the condition that said gripper claws pivot outwardly past said backup bar.

* * * * *